United States Patent [19]

Moh

[11] Patent Number: 5,204,289
[45] Date of Patent: Apr. 20, 1993

[54] GLASS-BASED AND GLASS-CERAMIC-BASED COMPOSITES

[75] Inventor: Kyung H. Moh, Woodbury, Minn.

[73] Assignee: Minnesota Mining and Manufacturing Company, St. Paul, Minn.

[21] Appl. No.: 779,016

[22] Filed: Oct. 18, 1991

[51] Int. Cl.$^5$ .................. C03C 4/16; C03C 3/089; C03C 10/06
[52] U.S. Cl. ........................... 501/5; 501/7; 501/8; 501/9; 501/32; 501/39; 501/61; 501/65; 501/67; 501/75; 428/450; 428/469
[58] Field of Search .............. 501/5, 7, 8, 9, 32, 501/39, 61, 65, 67, 75; 428/450, 469, 471, 472

[56] References Cited

U.S. PATENT DOCUMENTS

| | | | |
|---|---|---|---|
| 4,752,531 | 6/1988 | Steinberg | 428/426 |
| 4,867,935 | 9/1989 | Morrison, Jr. | 264/61 |
| 4,994,302 | 2/1991 | Kellerman | 427/96 |
| 5,077,241 | 12/1991 | Moh et al. | 501/12 X |
| 5,108,958 | 4/1992 | Moh et al. | 501/39 |

FOREIGN PATENT DOCUMENTS

| | | |
|---|---|---|
| 0234896 | 9/1987 | European Pat. Off. |
| 59-111345 | 2/1990 | Japan |
| 2235443 | 3/1991 | United Kingdom |

OTHER PUBLICATIONS

"Low Firing Temperature Multilayer Glass–Ceramic Substrate," *IEEE Transactions on Components, Hybrids, and Manufacturing Technology*, vol. 6, (4), Dec. 1983, pp. 382–386.

"Hollow glass microsphere composites: preparation and properties," *Journal of Materials Science*, 20, (1985), 1069–1078.

*Primary Examiner*—Karl Group
*Attorney, Agent, or Firm*—Gary L. Griswold; Walter N. Kirn; Gregory D. Allen

[57] ABSTRACT

This invention provides a composite article comprising mullite bubbles dispersed in one of a glass matrix and a glass-ceramic matrix, and a method of making the same. The composite ceramic article of the present invention is useful in applications requiring a material having a low dielectric constant, low dissipation factor, thermal expansion properties compatible with silicon, and good mechanical strength. The composite ceramic article of the present invention is particularly useful as a substrate for thick film circuits, housings for integrated circuit assemblies (i.e., covers), and materials such as gyrotron windows, that require transparency to microwaves or millimeter waves, in addition to acceptable power transmission efficiencies.

38 Claims, No Drawings

GLASS-BASED AND GLASS-CERAMIC-BASED COMPOSITES

FIELD OF THE INVENTION

This invention relates to a composite article comprising mullite bubbles dispersed in one of a glass matrix and a glass-ceramic matrix, and a method of making the same.

DESCRIPTION OF THE RELATED ART

"Electronic Packaging" typically refers to an assembly having semiconducting silicon chips attached to a substrate by conductive pathway, wherein the chips are encapsulated by plastic or ceramic materials. Conventional and electronic packaging include dual-in-line packages (DIP), chip carriers, flat packs, and pin grid arrays.

To increase the speed of electronic signals through the substrate, the substrate preferably has a low dielectric constant. The dielectric constant of the substrate is particularly important in high frequencies. State-of-the art electronic packaging media includes low dielectric polymeric material. Such polymers, however, have high thermal expansion coefficients (about $15 \times 10^{-6}/°C$.), which do not match very well with the thermal expansion coefficient of silicon (about $3.5 \times 10^{-6}/°C$.). Because silicon chips are adhered to the substrate, this thermal expansion coefficient mismatch results in thermally-induced mechanical stresses over a broad range of temperatures and, ultimately, failure of the component.

Glass-ceramic compositions have also been used for electronic applications. A glass-ceramic is traditionally defined as a composite material having a large (typically 95 to 98) volume percent of very small crystals (generally smaller than about 1 micrometer) of ceramic phase admixed with a small amount of residual glass phase making up a pore-free composite.

Glass-ceramic materials are typically produced by the controlled crystallization of glasses. Alternatively, a glass-ceramic can be formed admixing ceramic and glass powders and sintering them to produce a glass-ceramic material.

For example, UK Pat. Application No. 2,235,443 (Ismail et al.), published Mar. 3, 1991, describes a method for making composite mullite/cordierite ceramics, wherein mullite and cordierite sols are mixed together, gelled, and calcined to produce a mullite/cordierite ceramic, wherein the mullite is a ceramic and the cordierite is a glass-ceramic. The mullite/cordierite ceramic is said to be useful as an integrated circuit substrate material.

U.S. Pat. No. 4,752,531 (Steinberg) discloses a dielectric composition comprising an admixture of finely divided solids comprising (a) a noncrystallizable glass having a deformation temperature ($T_d$) of 580°-625° C. and a softening point ($T_s$) of 630°-700° C. and a $T_s$-$T_d$ of 50° to 75° C. and (b) a refractory which is substantially insoluble in glass at temperatures of 825° to 900° C. The dielectric constant of patentee's working examples ranged from 6.5 to 8.0 at 1 KHz.

Glass-ceramic substrates having a dielectric constant of about 5.6 made from glass and alumina powders are known in the art. These substrates are particularly useful because they can be sintered with copper or gold. See, for example, Shimade et al., "Low Firing Temperature Multi-Layer Glass-Ceramic Substrate," *IEEE Trans. Compon. Hybrids Manuf. Technol.*, 6, (4), pp. 382-86 (1983).

Hollow glass microspheres have been incorporated into glass, ceramic, and plastic matrices, for use in electronic applications. For example, U.S. Pat. No. 4,867,935 (Morrison, Jr.) describes a method for preparing a low dielectric constant glass composition comprising hollow glass microspheres in a glass matrix. This composition is castable in the form of a tape or sheet and a multi-layer sheet structure can be formed from the tape.

European Patent Application No. 0,234,896 (Kellerman), published Sep. 2, 1987, describes a low dielectric constant material for use in the formation of thick film circuits, the material comprising a thick film insulation matrix of standard viscosity, a thick film organic vehicle, and a plurality of dry, hollow glass microspheres.

Japanese Patent Application No. 59-111345, published Jun. 27, 1984, discloses hollow spheres (e.g., alumina microspheres) dispersed in a glass matrix. The reported dielectric constant of the composite is 4 to 5.

U.S. Pat. No. 4,994,302 (Kellerman) describes a method of making a ceramic tape by pressing hollow glass or alumina microspheres into a green ceramic tape and then firing.

U.S. Pat. No. 5,108,958 (Moh et al.), discloses a composite comprising hollow, thin walled, refractory ceramic (e.g., mullite) bubbles uniformly distributed throughout a refractory ceramic (e.g., aluminum phosphate, alumina, mullite, steatite, forsterite, and cordierite) matrix.

A thermal expansion mismatch between the components of a composite such as, for example, the matrix component and the bubble or microsphere component can cause performance problems. When such composites are heated, for example, to apply a metallization layer, warping can occur. If the thermal expansion mismatch is substantial, it can result in shattering of the bubbles within the matrix, or cracking of the matrix material.

The use of glass bubbles in matrices of composites heated to high temperatures (e.g., greater than about 900° C.) may be unsuitable. For example, substrates that must be co-fired with a metallization layer are typically heated at temperatures in the range from 850° to about 950° C. The substrate containing glass microspheres fired at such temperatures tends to have an irregular surface, to exhibit warping, and to become brittle. These undesired effects are due to glass bubbles softening and dissolving at metallization temperatures in the range from about 900° to about 950° C. For example, Verweij et al. in "Hollow Glass Microsphere Composites: Preparations and Properties," *J. Mater. Sci.*, 20, 1985, pp. 1069–78, reports on x-ray diffraction and scanning electron microscopy of silica microspheres which crystallize at temperatures used in the metallization process described above.

Cristobalite, a crystalline polymorph of silica, begins to form at temperatures in the range from about 600°-700° C. Its formation causes a volume expansion which results in the complete breakdown of the microspheres.

For electronic applications, it is desirable that substrates comprising microspheres have the microspheres intact. Broken or crushed microspheres cause loss of hermeticity and increase the dielectric constant.

For electronic applications, there is a need for a substrate which has utility and firing temperatures up to about 950° C., low dielectric constant (less than about 6), high mechanical strength, low open porosity (preferably, no open porosity), retention of shape during firing, and a smooth surface (i.e., low camber, preferably, less than about ±0.05 mm).

SUMMARY OF THE INVENTION

The present invention provides a composite ceramic article comprising a plurality of mullite bubbles dispersed in a matrix selected from the group consisting of a borosilicate-based glass matrix and an aluminosilicate-based glass-ceramic matrix. The composite ceramic article according to the present invention may further comprise an electrically-conductive material coated on a surface thereof.

Those skilled in the art use the term "ceramic" in the broad or generic sense to include glass, glass-ceramic, and crystalline ceramic, and in the narrow sense to mean crystalline ceramic. The term "ceramic" is used herein in the generic sense to include glass, glass-ceramic, and crystalline ceramic.

The term "glass" as used herein refers to an amorphous (i.e., a material having a diffuse x-ray diffraction pattern without definite lines to indicate the presence of a crystalline phase) inorganic oxide material that softens or loses structural integrity at high temperature (e.g., above about 900° C.).

The term "crystalline ceramic" as used herein refers to a crystalline inorganic oxide material that maintains its structural integrity at high temperatures (above about 1000° C.).

The term "glass-ceramic" as used herein refers to a composite material having a large (preferably, 95 to 98) volume percent of very small crystals (preferably, smaller than about 1 micrometer) of crystalline ceramic phase admixed with a small amount of glass phase making a composite essentially free of open porosity. Although a crystalline ceramic material that has been densified via liquid phase sintering may have a very small amount of an amorphous or glassy phase at the grain boundaries, such a material is not referred to by those skilled in the art as a glass-ceramic.

In another aspect, the present invention provides a green composite article comprising a plurality of mullite bubbles dispersed in a matrix selected from the group consisting of a borosilicate-based glass powder matrix, an aluminosilicate-based glass powder matrix, an aluminosilicate-based glass-ceramic powder matrix, and an aluminosilicate-based glass powder and aluminosilicate-based glass-ceramic powder matrix.

In another aspect, the present invention provides a method of making a composite ceramic article comprising a plurality of mullite bubbles dispersed in a matrix selected from the group consisting of a borosilicate-based glass matrix and an aluminosilicate-based glass-ceramic matrix, the method comprising the steps of:

(a) shaping a slurry comprising a liquid media, a plasticizer, a binder, a plurality of mullite bubbles, and a matrix selected from the group consisting of borosilicate-based glass powder, aluminosilicate-based glass powder, aluminosilicate-based glass-ceramic powder, and aluminosilicate-based glass powder and aluminosilicate-based glass-ceramic powder;

(b) drying said shaped slurry to provide a green article; and (c) sintering said green article.

One aspect of the method of the present invention is that a green or partially sintered article can be co-fired with a precursor of a highly electrically conductive material (e.g., gold, silver, silver/palladium, and copper) on a surface thereof.

The composite ceramic article of the present invention is useful in applications requiring a material having a low dielectric constant, low dissipation factor, thermal expansion properties compatible with silicon, and good mechanical strength. The composite ceramic article of the present invention is particularly useful as a substrate for thick film circuits, housings for integrated circuit assemblies (i.e., covers), and materials such as gyrotron windows, that require transparency to microwaves or millimeter waves, in addition to acceptable power transmission efficiencies.

DETAILED DESCRIPTION OF THE PREFERRED EMBODIMENTS

Typically, the composite article according to the present invention comprises mullite bubbles in the range from about 15 to about 70 percent by volume, based on the total volume of the composite ceramic article. Preferably, mullite bubbles are present in the range from about 15 to about 40 percent by volume, based on the total volume of said composite ceramic article, and, most preferably, in the range from about 20 to about 30 percent by volume. The presence of mullite bubbles substantially less than about 15 percent by volume tend to provide a composite ceramic article that is too brittle.

The presence of mullite bubbles substantially greater than about 70 percent by volume tend to provide a composite ceramic article having a flexural strength and a camber (i.e., a high camber, wherein camber is the uniformity of flatness over the entire dimension of the article) that is inferior to that of ceramic articles having mullite bubbles in the preferred ranges.

In the selection of the raw materials used to prepare the composite ceramic article according to the present invention, and in the selection of the means by which the raw materials are processed, care should be taken to minimize the introduction of contaminates which may adversely affect the electrical properties of the composite ceramic article. Contaminates that adversely affect the electrical properties of the composite ceramic article include, for example, $Na_2O$ or $K_2O$. Preferably, the amount of $Na_2O$, if present, in the composite ceramic article used in an electronic application is less than about 50 ppm. Preferably, the amount of $K_2O$, if present, in the composite ceramic article used in an electronic application is less than about 2 percent by weight, and, more preferably, less than about 1 percent by weight.

Suitable mullite bubbles or microspheres can be prepared by the method described in U.S. Pat. No. 5,077,241 (Moh et al.) the disclosure of which is incorporated herein by reference. Such mullite bubbles or microspheres typically are transparent to visible light. Preferably, the mullite bubbles are prepared by heating the aluminum borosilicate bubbles identified as #4 in Table 2 of assignee's copending application just referred to in air at about 1200° C. for about 3 hours. Alternatively, preferred mullite bubbles are those identified as #9 in Table 2 of the same copending application.

Preferably, the mullite or mullite-based bubbles are refractory (i.e., maintain structural usefulness and integrity up to at least about 1800° C.), crystalline ceramic.

The bulk density of the mullite bubbles is typically in the range from about 0.3 to about 0.6 g/cm$^3$.

Typically, suitable mullite bubbles have a diameter up to about 50 micrometers. Preferably, the mullite bubbles have a diameter in the range from about 1 to about 50 micrometers. More preferably, the diameter of the mullite bubbles is in the range from about 1 to about 15 micrometers, and, most preferably, in the range from about 1 to about 10 micrometers.

Mullite bubbles having diameters less than about 1 micrometer may be useful, but tend to be difficult to make. Use of mullite bubbles having diameters substantially greater than about 15 micrometers tend to provide composite ceramic articles having lower densities, inferior camber, and poor mechanical properties than does the use of mullite bubbles having diameters within the preferred ranges.

Preferably, the wall thickness of the mullite bubbles are in the range from about 0.05 to about 0.5 micrometer. Bubbles having wall thicknesses substantially lower than about 0.05 micrometer tend to be too fragile to be processed into the composite ceramic article.

Suitable borosilicate-based glasses include those known in the art in the systems selected from the group consisting of lead borosilicate, lithium borosilicate, potassium borosilicate, calcium borosilicate, sodium borosilicate, magnesium borosilicate, barium borosilicate, aluminum borosilicate, and combinations thereof. The most preferred borosilicate-based glass is lead boroaluminosilicate glass.

Preferably, the borosilicate-based glass has a thermal expansion coefficient in the temperature range from about 25° to about 300° C., in the range from about $1 \times 10^{-6}$ to about $9 \times 10^{-6}$/°C. More preferably, the thermal expansion coefficient of the borosilicate-based glass in the range from about 25° to about 300° C. is in the range of about $1.2 \times 10^{-6}$ to about $8.8 \times 10^{-6}$/°C., and, even more preferably, in the range from about $2 \times 10^{-6}$/°C. to about $5 \times 10^{-6}$/°C. Most preferably, the thermal expansion coefficient is in the range from about $3 \times 10^{-6}$ to about $4 \times 10^{-6}$/°C.

The borosilicate-based glass preferably has a dielectric constant at 1 MHz in the range from about 2 to about 6, and a dissipation factor of less than about 0.004. More preferably, the borosilicate-based glass has a dielectric constant at 1 MHz in the range from about 3 to about 5, and a dissipation factor of less than about 0.002. The term "dissipation factor" as used herein means the ratio between the recoverable (stored) and irrecoverable (lost as heat) energy in a material when an electrical field has been applied to it.

Suitable borosilicate-based glasses are commercially available, for example, from Ferro Corporation of Cleveland, Ohio, and Corning Glass Company of Corning, N.Y.

Suitable aluminosilicate-based glasses and glass-ceramics include those known in the art in the systems selected from the group consisting of magnesium aluminosilicate, lithium aluminosilicate, zinc aluminosilicate, calcium aluminosilicate, and combinations thereof, wherein the aluminosilicate-based glass is a precursor to an aluminosilicate-based glass-ceramic. The most preferred aluminosilicate-based glass is a magnesium aluminosilicate glass. The most preferred aluminosilicate-based glass-ceramic is a magnesium aluminosilicate glass-ceramic.

The aluminosilicate-based glass or glass-ceramic may further comprise nucleating agents known in the art.

Known crystalline ceramic phases within the above identified aluminosilicate glass-ceramics include, for example cordierite ($2MgO.2Al_2O_3.5SiO_2$) gehlenite ($2CaO.Al_2O_3.SiO_2$), anorthite ($2CaO.Al_2O_3.2SiO_2$), hardystonite ($2CaO.ZnO.2SiO_2$), akermanite ($2CaO.MgO.2SiO_2$), spodumene ($Li_2O.Al_2O_3.4SiO_2$), willemite ($2ZnO.SiO_2$), and gahnite ($ZnO.Al_2O_3$).

In addition to the aluminosilicate glass powder glass-ceramic powder, or combination thereof, the slurry may further comprise crystalline ceramic aluminosilicate-based powders.

Preferably, the aluminosilicate-based glass-ceramic has a thermal expansion coefficient in the temperature range from about 25° to about 300° C. in the range from about $1 \times 10^{-6}$ to about $9 \times 10^{-6}$/°C. More preferably, the thermal expansion coefficient of the aluminosilicate-based glass-ceramic from about 25° to about 300° C. is in the range from about $1.2 \times 10^{-6}$ to about $8.8 \times 10^{-6}$/°C., and, even more preferably, in the range from about $2 \times 10^{-6}$ to about $5 \times 10^{-6}$/°C. Most preferably, the thermal expansion coefficient is in the range from about $3 \times 10^{-6}$ to about $4 \times 10^{-6}$/°C.

The aluminosilicate-based glass-ceramic preferably has a dielectric constant at 1 MHz in the range from about 2 to about 6, and a dissipation factor of less than about 0.004. More preferably, the aluminosilicate-based glass-ceramic has a dielectric constant at 1 MHz in the range from about 3 to about 5, and a dissipation factor of less than about 0.002.

Suitable magnesium aluminosilicate glass-ceramics are commercially available, for example, from Specialty Glass Company of Oldsmar, Fla.

The particle size of the glass and glass-ceramic powder used to prepare the slurry preferably is less than about 8 micrometers. More preferably, the particle size of the powder is in the range from about 1 to about 6 micrometers.

The particle size of the borosilicate-based glass or the aluminosilicate-based glass or glass-ceramic may be reduced using techniques known in the art, including, for example, crushing, wet ball milling, dry ball milling, and jet milling.

The liquid media for wet ball milling of the glass or glass-ceramic, if necessary, and for preparing the slurry is water, an organic liquid, or combination thereof. The preferred liquid media is an organic liquid. Preferred organic liquids include, for example, toluene, trichloroethylene, ethyl alcohol, and combinations thereof.

Typically, the liquid media is present in the range from about 40 to about 70 percent by volume, based on the total volume of the ball mill ingredients.

The borosilicate-based glass or the aluminosilicate-based glass, glass-ceramic, or glass and glass-ceramic powder, mullite bubbles, liquid media, plasticizer, and binder can be mixed by conventional techniques including, for example, air propelled stirrer or sonic dispersion. Care should be taken in mixing the raw materials to minimize damage to the mullite bubbles, and to minimize contamination to the slurry, for example, from the container, mixing blades, etc.

To minimize damage to the mullite bubbles or microspheres, the glass or glass-ceramic powder, liquid media, plasticizer, and binder are preferably thoroughly mixed prior to adding the mullite bubbles.

Suitable liquid media for the slurry are those described above for wet ball milling of the glass or glass-ceramic. Typically, the liquid media is present in the range from about 40 to about 70 percent by volume, based on the total volume of the slurry ingredients (including the mullite bubbles).

To remove air which may be trapped in the slurry, the slurry is typically deaerated under a vacuum, for example, by use of an aspirator.

The slurry comprises conventional organic binders and plasticizer known in the art to aid in the formation of a green article. Useful organic plasticizers include, for example, glycerol, polyethylene glycol (commercially available, for example, under the trade designation "PEG 2000" from Union Carbide of Danbury, Conn.), polyalkylene glycol, butyl benzyl phthalate, and dioctyl phthalate (commercially available, for example, under the trade designation "DOP" from Aldrich Chemical Co. of Milwaukee, Wis.). The weight ratio of the plasticizer to glass powder or glass-ceramic powder is typically in the range from about 1:10 to about 1:15. Useful organic binders include, for example, poly(vinyl) alcohol, polyvinyl butyral (commercially available, for example, under the trade designation "BUTVAR B76" from Monsanto Polymers and Petrochemicals of St. Louis, Mo.), and acrylic polymer emulsions. The weight ratio of binder to glass powder or glass-ceramic powder is typically in the range from about 1:9 to about 1:15.

The slurry may further comprise dispersing aids known in the art, including, for example, corn oil and fish oil.

The slurry may be formed into the desired shape using conventional techniques such as tape casting, extrusion, and slip-casting. The preferred method for shaping the slurry is tape casting. The preferred shape is a sheet or a wafer. Typically, a sheet is cast and then subsequently converted into wafers. Preferably, a green sheet is cut into wafers.

Tape casting is a conventional method that utilizes a doctor blade or knife blade. For tape casting, the viscosity of the slurry is preferable in the range from about 2000 to about 2900 cps, as determined using a conventional viscometer (e.g., commercially available under trade designation "Model RVT Viscometer" from Brookfield Engineers of Stoughton, Mass.). The viscosity of the slurry, which is typically too low, can be increased by removal of a portion of the liquid media. Typically, liquid media is removed from the slurry during mixing by evaporation.

The shaped slurry is carefully dried to produce an uncracked, unwarped green article. Drying can be by any of several conventional liquid media removal techniques including, for example, heating. Preferably, the shaped slurry is heated in air at a temperature in the range from about 25° to about 40° C.

The thickness of a green tape is typically in the range from about 0.2 to about 2 mm.

Preferably, the green article of the present invention is heated to a temperature and for a time sufficient to burn out organic substituents. More preferably, the green article is slowly heated to a temperature in the range from about 25° to about 350° C. for a time sufficient to burn out organic substituents (i.e., calcined). The preferred heating rate is dependent on the atmosphere in which the article is heated, and the amount and type of organic substituent present. Preferably, the heating rate is slow enough to minimize or prevent cracking, bloating, or distortion of the green article during removal of organic substituents. Preferably, green article is heated in air.

The sintering and temperature is that sufficient to densify, preferably fully densify, the glass or glass-ceramic matrix material. The sintering atmosphere is typically air. Typically, the sintering temperature is in the range from about 820° to about 950° C. For a composite article comprising a borosilicate-based glass, the sintering temperature is preferably in the range from about 820° to about 850° C. On the other hand, for a composite article comprising an aluminosilicate-based glass-ceramic, the sintering temperature is preferably in the range from about 820° to about 950° C.

In sintering an article derived from aluminosilicate-based glass powder, the heating schedule may need to be modified in order to allow for the desired nucleation and growth of the aluminosilicate-based glass-ceramic. The modification is dependent on the composition of the aluminosilicate-based glass. The heating conditions required to nucleate and grow the aluminosilicate-based glass-ceramic are known in the art for a variety of compositions. Alternatively, one skilled in the art can determine the proper heating conditions from a Time-Temperature-Transformation (TTT) study of the glass.

The thickness of a sheet or a wafer of the composite ceramic article according to the present invention is preferably in the range from about 0.1 to about 1 mm.

The density of the composite ceramic article is typically in the range from about 0.70 to about 2.2 g/cm$^3$. Preferably, the density of the composite ceramic article is in the range from about 0.85 to about 2.2 g/cm$^3$. Typically, the flexural strength of the composite ceramic article, as determined by ASTM procedure F417 (1984) entitled "Modulus of Rupture Test for Electric/Electronic Devices" (1990 Book of ASTM Standards, Vol. 10.04, Amer. Soc. for Testing and Materials, 1990), the disclosure of which is incorporated herein by reference, is greater than about 15 MPa. Preferably, the flexural strength is greater strength than about 50 MPa. More preferably, the flexural strength of the composite ceramic article is greater than about 70 MPa, and, even more preferably, greater than about 90 MPa.

The camber of the composite ceramic article is preferably less than about ±0.05 mm.

For a composite ceramic article comprising an aluminosilicate glass-ceramic, the grain size of the ceramic phase is preferably less than about 1 micrometer.

Preferably, the composite ceramic article according to the present invention at a temperature of about 25° C. has a dielectric constant at 1 MHz in the range from about 2 to about 6, and a dissipation factor of less than about 0.004. More preferably, the composite ceramic article at about 25° C. has a dielectric constant at 1 MHz in the range from about 3 to about 5, and a dissipation factor of less than about 0.002.

Preferably, the composite ceramic article according to the present invention has a thermal expansion coefficient in the temperature range from about 25° to about 300° C. in the range from about $1 \times 10^{-6}$ to about $9 \times 10^{-6}$/°C. More preferably, the thermal expansion coefficient of the composite ceramic article from about 25° to about 300° C. is in the range from about $2 \times 10^{-6}$ to about $5 \times 10^{-6}$/°C., and even more preferably, in the range from about $3 \times 10^{-6}$ to about $4 \times 10^{-6}$/°C.

Homogeneity of the composite ceramic article according to the present invention is important in order to obtain consistent and reproducible dielectric constants and dissipation factors throughout certain temperature ranges and frequencies. Homogeneity of the composite ceramic article can be obtained by using micro-sized bubbles having a narrow size distribution. The composite ceramic article must have many bubbles per cubic wavelength of electromagnetic radiation (i.e., the diameter of the bubbles is an appreciable fraction of the wavelength of the incident radiation) for the article to behave as a homogeneous material. If the diameter of the bubbles are an appreciable fraction of the wavelength of the incident radiation, the bubbles will act as individual scatterers. For example, for high frequency radiation (e.g., 100 GHz), the bubbles must have diameters on the order of tens of micrometers or less.

Physical, electrical, mechanical, and thermal properties of the composite ceramic article can be tailored by varying the composition of the article.

A composite ceramic article according to the present invention, when used as an electronic substrate having a silicon chip thereon, the thermal expansion coefficient of the composite ceramic from about 25° to about 300° C. is preferably about the same as the thermal expansion coefficient of silicon (i.e., from about 25° to about 300° C. in the range from about $3.4 \times 10^{-6}$ to about $4 \times 10^{-6}/°C.$).

For a composite ceramic article further comprising an electrically conductive material coated on a surface thereof, the process for preparing the composite ceramic article can be modified by techniques known in the art for applying a thick film of an electrically conductive material onto a surface of a ceramic for use as an integrated circuit component. For example, a precursor of an electrically conductive material (e.g., a metal paste) can be applied to a surface of the green article, a partially sintered green article, a composite ceramic article, or a combination thereof. The paste can be applied to a surface using techniques known in the art including, for example, screen printing.

Suitable electrically conductive metal pastes are commercially available, for example, from E. I. Dupont de Nemours of Wilmington, Del. Preferred electrically conductive metals include those selected from the group consisting of gold, silver, silver/palladium, and copper.

The paste typically needs to be heated to a temperature sufficient to allow the metal comprising the paste to wet the surface of the glass or glass-ceramic-based article.

Preferably, the paste is dried prior to heating to the sintering temperature of the ceramic composite. If the paste has been applied to a green article, a calcined article, or a partially sintered article, the resulting composite article can be co-fired to the sintering temperature required to provide the composite ceramic article.

It is within the scope of the present invention to make multilayer composite ceramic articles that optionally have electrically conductive materials on the surface of one or more of the layers. Further, a multilayer composite ceramic article having electrically conductive material on the surface of two or more layers may have electrical connections there between.

The composite ceramic article of the present invention is useful in applications requiring a material having a low dielectric constant, low dissipation factor, thermal expansion properties compatible with silicon, and good mechanical strength. The composite ceramic article of the present invention is particularly useful as a substrate for thick film circuits, housings for integrated circuit assemblies (i.e., covers), and materials such as gyrotron windows, that require transparency to microwaves or millimeter waves, in addition to acceptable power transmission efficiencies.

Objects and advantages of this invention are further illustrated by the following examples, but the particular materials and amounts thereof recited in these examples, as well as other conditions and details, should not be construed to unduly limit the invention. All parts and percentages are by weight unless otherwise indicated.

EXAMPLE 1

A 2600 cm$^3$ porcelain ball mill was charged with about 1400 grams of alumina grinding media (1.5 cm diameter; commercially available from U.S. Stoneware Co. of Mahwah, N.J.), about 683 grams of toluene, about 6.7 grams of corn oil, about 41.6 grams of dioctylphthalate (commercially available under the trade designation "DOP" from Aldrich Chemical Co. of Milwaukee, Wis.), about 25 grams of polyethylene glycol (2000 cps; commercially available under the trade designation "PEG 2000" from Union Carbide of Danbury, Conn), and about 335 grams of a lead boroaluminosilicate glass powder (commercially available under the trade designation "IP 745REG" from Ferro Corporation of Cleveland, Ohio). The ingredients were ball milled at a speed of about 100 rpm for about 16 hours. About 35.9 grams of polyvinyl butyral (commercially available under the trade designation "BUTVAR B76" from Monsanto Polymers and Petrochemicals of St. Louis, Mo.) was added to the ball mill. The ingredients were then ball milled for an additional 2 hours.

Mullite bubbles were prepared by heating the aluminum borosilicate bubbles identified as #4 in Table 2 of U.S. Pat. No. 5,077,241 (Moh et al.) the disclosure of which is incorporated herein by reference, in air at about 1200° C. for about 3 hours. About 15 grams of the mullite bubbles having a diameter in the range from about 2-15 micrometers were added to about 100 milliliters of the resulting ball-milled slurry from above, and stirred at about 300 rpm using a conventional air propelled mixer having a 3.2 centimeter blade. The slurry-mullite bubble mixture thickened during stirring as liquid media evaporated. When the viscosity of the slurry/mullite bubble mixture increased to about 2900 cps, the mixture was placed under vacuum using aspirator pressure to deaerate.

The deaerated slurry/mullite bubble mixture was then uniformly cast onto a silicone-coated polyester film using a conventional doctor-blade technique. The cast tape was allowed to dry at room temperature for about 10 hours. The dried tape was then stripped from the polyester film to provide a green sheet, The green sheet was cut into 3.2 cm by 2.4 cm pieces.

To test the utility of a composite ceramic article according to the present invention as an electronic substrate, several green pieces were metallized by coating a palladium/silver metal paste (commercially available under the trade designation "PD/AG 6120" from E. I. Dupont de Nemours of Wilmington, Del.) on a surface thereof. The metal paste was silk-screened onto the green substrates by conventional techniques. The screened conductive metal paste was then dried in an oven at about 80° C. for about 30 minutes.

The resulting article was then sintered in a conventional resistive furnace in air according to the following schedule:

Room temperature to about 350° C. at about 30° C./minute;

Held at about 350° C. for about 1 hour;

350° C. to about 850° C. at about 30° C./minute; and
Held at about 850° C. for about 12 minutes.

The linear shrinkage of the sintered composite ceramic article was about 12.5 percent. The camber of the sintered composite ceramic article was less than about ±0.05 millimeter. The density of the sintered composite ceramic article was about 1.7 grams/cm$^3$.

The dielectric constant and dissipation factor of the sintered composite ceramic article was measured using a conventional impedance analyzer (commercially available under the trade designation "HP 4192A ANALYZER" from Hewlett Packard Corp. of Palo Alto, Calif.). The dielectric constant of the sintered composite ceramic article at about 25° C. at 1 MHz was about 3.5, with a dissipation factor of about 0.0001.

The flexural strength (i.e., 3 point modulus of rupture) was determined by ASTM procedure F417 (1984) entitled "Modulus of Rupture Test for Electric/Electronic Device" (1990 Book of ASTM Standards, Vol. 10.04, Amer. Soc. for Testing and Materials, 1990), the disclosure of which is incorporated herein by reference. The flexural strength of the sintered composite ceramic article was about 98 MPa (14,000 psi).

The coefficient of thermal expansion was measured over the temperature range from about 20° to about 400° C. using a conventional thermal analysis system (commercially available under the trade designation "PERKIN-ELMER 7 SERIES THERMAL ANALYSIS SYSTEM" from Perkin-Elmer Corp. of Norwalk, Conn.). The thermal expansion coefficient of the sintered composite ceramic article was about $3.5 \times 10^{-6}$/°C.

A cross-section of the Example 1 composite ceramic article was examined using a scanning electron microscope. The mullite bubbles were observed to be uniformly dispersed throughout the glass matrix.

EXAMPLE 2

Example 2 illustrates the effect of the amount of mullite bubbles present in the sintered composite ceramic article. Examples 2A, 2B, 2C, and 2D were prepared and tested as described in Example 1, except the volume of mullite bubbles present in the sintered composite ceramic article was varied from about 28 to about 56 volume percent, based on the total volume of the sintered composite ceramic article, and the diameter of the mullite bubbles were in the range from about 2 to about 30 micrometers.

The results are reported in Table 1 below.

TABLE 1

| Example | Volume percent mullite bubbles, % | Dielectric constant at 1 MHz (at 25° C.), k | Dissipation factor at 1 MHz (at 25° C.) |
|---|---|---|---|
| 2A | 28 | 6.1 | 0.0020 |
| 2B | 34 | 5.3 | 0.0016 |
| 2C | 43 | 4.6 | 0.0023 |
| 2D | 56 | 3.0 | 0.0005 |

The dielectric constant of the sintered composite ceramic article decreased as the percentage of mullite bubbles present in the composite article increased. The reported dielectric constant of lead borosilicate glasses is in the range from about 7 to about 8.

EXAMPLE 3

Example 3 illustrates a composite ceramic article according to the present invention comprising a magnesium aluminosilicate glass-ceramic. A 2600 cm$^3$ porcelain ball mill was charged with about 1400 grams of alumina grinding media (1.5 cm diameter; from U.S. Stoneware Co.), about 300 grams of a cordierite glass powder (commercially available under the trade designation "SP 980" from Specialty Glass Company of Oldsmar, Fla.), about 6 grams of corn oil, about 612 grams of toluene, about 22.4 grams of polyethylene glycol ("PEG 2000"), in about 37.3 grams of dioctyl phthalate ("DOP"). The raw materials were ball milled for about 4 hours. About 32.2 grams of polyvinyl butyral ("BUTVAR B76") were added to the ball mill. The raw materials were then further ball milled for about 2 hours. About 100 milliliters of the resulting slurry was mixed with about 6 grams of mullite bubbles (prepared as described in Example 1) having a diameter of about 10 micrometers. The resulting slurry was shaped, dried, and screen printed with a palladium/silver thick film conductor as described in Example 1 and then sintered as described in Example 1, except the heating schedule was as follows:

Room temperature to about 350° C. at about 15°/minute;
Held at about 350° C. for about 1 hour;
350° C. to about 950° C. at about 15°/minute; and
Held at about 950° C. for about 1 hour.

The mullite bubbles comprised about 28 volume percent of the sintered composite ceramic article. The sintered composite ceramic article was tested as described in Example 1.

The camber of the sintered composite ceramic article was less than about ±0.05 millimeter. The density of the sintered composite ceramic article was about 2.27 g/cm$^3$.

The dielectric constant of the sintered composite ceramic article at about 25° C. at 1 MHz was about 4.4, with a dissipation factor of about 0.0012.

The flexural strength of the sintered composite ceramic article was about 84 MPa (12,000 psi).

EXAMPLE 4

Example 4 was prepared and tested as described in Example 3 except the volume percent of mullite bubbles present in the sintered composite ceramic articles was varied from about 21 to about 35 volume percent, and the diameter of the mullite bubbles was in the range from about 15 to about 30 micrometers. The results are given in Table 2, below.

TABLE 2

| Example | Volume percent mullite bubbles, % | Density of sintered composite ceramic article, g/cm$^3$ | Dielectric constant at 1 MHz (at 25° C.), k | Dissipation factor at 1 MHz (at 25° C.) | Flexural Strength, MPa (Ksi) |
|---|---|---|---|---|---|
| 4A | 21 | 2.2 | 5.2 | 0.0017 | 75.6 (10.8) |
| 4B | 28 | 1.8 | 4.4 | 0.0015 | 55.3 (7.9) |
| 4C | 35 | 1.9 | 4.0 | 0.0007 | 58.1 (8.3) |

The dielectric constant decreased as the volume percent of mullite bubbles present in the sintered ceramic articles increased.

EXAMPLE 5

Example 5 was prepared and tested as described in Example 3 except the volume percent of mullite bubbles present in the sintered composite ceramic was varied from about 28 to about 57 volume percent, and the diameter of the mullite bubbles was in the range from about 30 to about 50 micrometers. The results are given in Table 3, below.

TABLE 3

| Example | Volume percent mullite bubbles, % | Density of sintered composite ceramic article, g/cm$^3$ | Dielectric constant at 1 MHz (at 25° C.), k | Dissipation factor at 1 MHz (at 25° C.) | Flexural Strength, MPa (Ksi) |
| --- | --- | --- | --- | --- | --- |
| 5A | 28 | 1.5 | 3.9 | 0.0009 | 46.2 (6.6) |
| 5B | 35 | 1.1 | 3.3 | 0.0008 | 30.1 (4.3) |
| 5C | 44 | 1.0 | 2.5 | 0.0009 | 23.1 (3.3) |
| 5D | 57 | 0.85 | 2.3 | 0.0009 | 16.8 (2.4) |

The sintered composite ceramic articles of Example 5 appeared to be smooth, white, and free of cracks. The sintered composite ceramic articles did not appear to exhibit warpage. The dielectric constant and density decreased as the volume percent loading of bubbles increased, consistent with the incorporation of a larger percent of air in the composite. The flexural strength decreased with higher loadings of mullite bubbles.

The thermal expansion coefficient of Example 5B from about 25° C. to about 400° C. was about $1.17 \times 10^{-6}/°C$.

COMPARATIVE EXAMPLE

A composite ceramic article comprising alumina bubbles dispersed in a magnesium aluminosilicate glass-ceramic was prepared.

The comparative example was prepared and tested as described in Example 3 except alumina microbubbles (diameter of about 6 micrometers; bulk density of about 1 g/cm$^3$; commercially available from ZYP Coatings, Inc., of Oak Ridge, Tenn.) were used in place of the mullite bubbles. The sintering schedule was the same as described in Example 3.

The dielectric constant of the sintered composite ceramic article at about 25° C. at 1 MHz was about 4.85, with a dissipation factor of about 0.01. The flexural strength of the sintered composite ceramic article was about 40.6 MPa (5.8 ksi). The relatively low flexural strength is believed to be due to insufficient densification.

To further densify the sintered comparative example, it was further sintered at about 980° C. for about 1 hour. When sintered to this higher temperature, however, the composite ceramic article lost planarity, presumably due to the thermal expansion mismatch of the magnesium aluminosilicate glass-ceramic matrix (typically about $2 \times 10^{-6}/°C$.) and the alumina microbubbles (typically about $8.8 \times 10^{-6}/°C$.). Further, the ceramic article sintered at 980° C. appeared to be warped and exhibited cracks.

Various modifications and alterations of this invention will become apparent to those skilled in the art without departing from the spirit of this invention, and it should be understood that this invention is not to be unduly limited to the illustrative embodiments set forth herein.

What is claimed is:

1. A composite ceramic article comprising a plurality of crystalline mullite bubbles dispersed in a matrix selected from the group consisting of a borosilicate-based glass matrix and an aluminosilicate-based glass-ceramic matrix.

2. The composite ceramic article according to claim 1 wherein said borosilicate-based glass has a softening point in the range from about 625° to about 650° C. and a thermal expansion coefficient in the temperature range from about 25° to about 300° C. in the range from about $1 \times 10^{-6}$ to about $9 \times 10^{-6}/°C$., and said aluminosilicate-based glass-ceramic has a softening point in the range from about 630° to about 700° C. and a thermal expansion coefficient in the temperature range from about 25° to about 300° C. in the range from about $1 \times 10^{-6}$ to about $9 \times 10^{-6}/°C$.

3. The composite ceramic article according to claim 2 wherein said borosilicate-based glass is in a system selected from the group consisting of lead borosilicate, lithium borosilicate, potassium borosilicate, calcium borosilicate, sodium borosilicate, magnesium borosilicate, barium borosilicate, aluminum borosilicate, and combinations thereof.

4. The composite ceramic article according to claim 2 wherein said borosilicate-based glass is lead boroaluminosilicate glass.

5. The composite ceramic article according to claim 2 wherein said aluminosilicate-based glass-ceramic is in a system selected from the group consisting of magnesium aluminosilicate, lithium aluminosilicate, zinc aluminosilicate, calcium aluminosilicate, and combinations thereof.

6. The composite ceramic article according to claim 2 wherein said aluminosilicate-based glass-ceramic is a magnesium aluminosilicate glass-ceramic.

7. The composite ceramic article according to claim 2 having a dielectric constant at 1 MHz in the range from about 2 to about 6 and a dissipation factor of less than about 0.004.

8. The composite ceramic article according to claim 2 having a dielectric constant at 1 MHz in the range from about 3 to about 5 and a dissipation factor of less than about 0.002.

9. The composite ceramic article according to claim 2 having a thermal expansion coefficient in the temperature range from about 25° to about 300° C. in the range from about $1 \times 10^{-6}$ to about $9 \times 10^{-6}/°C$.

10. The composite ceramic article according to claim 2 having a thermal expansion coefficient in the temperature range from about 25° to about 300° C. in the range from about $2 \times 10^{-6}$ to about $5 \times 10^{-6}/°C$.

11. The composite ceramic article according to claim 2 having a thermal expansion coefficient in the temperature range from about 25° to about 300° C. in the range from about $3 \times 10^{-6}$ to about $4 \times 10^{-6}/°C$.

12. The composite ceramic article according to claim 2 further comprising an electrically-conductive material coated on a surface thereof.

13. The composite ceramic article according to claim 12 wherein said electrically-conductive material is a material selected from the group consisting of gold, silver, silver/palladium, and copper.

14. The composite ceramic article according to claim 2 wherein said crystalline mullite bubbles have a diameter up to about 50 micrometers.

15. The composite ceramic article according to claim 2 wherein said crystalline mullite bubbles have a diameter in the range from about 1 to about 50 micrometers.

16. The composite ceramic article according to claim 2 wherein said crystalline mullite bubbles have a diameter in the range from about 5 to about 15 micrometers.

17. The composite ceramic article according to claim 2 wherein said crystalline mullite bubbles are present in the range from about 15 to about 70 percent by volume, based on the total volume of said composite ceramic article.

18. The composite ceramic article according to claim 2 wherein said crystalline mullite bubbles are present in the range from about 15 to about 40 percent by volume, based on the total volume of said composite ceramic article.

19. A green composite article comprising a plurality of crystalline mullite bubbles dispersed in a matrix selected from the group consisting of a borosilicate-based glass powder matrix, an aluminosilicate-based glass powder matrix, an aluminosilicate-based glass-ceramic powder matrix, and an aluminosilicate-based glass powder and aluminosilicate-based glass-ceramic powder matrix.

20. The green composite article according to claim 19 wherein said borosilicate-based glass has a softening point in the range from about 625° to about 650° C. and a thermal expansion coefficient in the temperature range from about 25° to about 300° C. in the range from about $1 \times 10^{-6}$ to about $9 \times 10^{-6}$/°C., and said aluminosilicate-based glass-ceramic has a softening point in the range from about 630° to about 700° C. and a thermal expansion coefficient in the temperature range from about 25° to about 300° C. in the range from about $1 \times 10^{-6}$ to about $9 \times 10^{-6}$/°C.

21. The green composite article according to claim 20 wherein said mullite bubbles have a diameter up to about 50 micrometers.

22. The green composite article according to claim 20 wherein said borosilicate-based glass is in a system selected from the group consisting of lead borosilicate, lithium borosilicate, potassium borosilicate, calcium borosilicate, sodium borosilicate, magnesium borosilicate, barium borosilicate, aluminum borosilicate, and combinations thereof.

23. The green composite article according to claim 20 wherein said borosilicate-based glass is in a system selected from the group consisting of lead borosilicate, lithium borosilicate, calcium borosilicate, magnesium borosilicate, barium borosilicate, aluminum borosilicate, and combinations thereof, and said aluminosilicate-based glass and said aluminosilicate-based glass-ceramic are independently in a system selected from the group consisting of magnesium aluminosilicate, lithium aluminosilicate, zinc aluminosilicate, calcium aluminosilicate, and combinations thereof.

24. The green composite article according to claim 23 further comprising an electrically-conductive paste coated on a surface thereof.

25. A method for making a composite article, said method comprising the steps of:
(a) shaping a slurry comprising a liquid media, a plasticizer, a binder, a plurality of crystalline mullite bubbles, and a matrix selected from the group consisting of borosilicate-based glass powder, an aluminosilicate-based glass powder, an aluminosilicate-based glass-ceramic powder, and an aluminosilicate-based glass powder and aluminosilicate-based glass-ceramic powder;
(b) drying said shaped slurry,
to provide a green composite article comprising a plurality of mullite bubbles dispersed in a matrix selected from the group consisting of a borosilicate-based glass powder matrix, an aluminosilicate-based glass powder matrix, an aluminosilicate-based glass-ceramic powder matrix, and an aluminosilicate-based glass powder and aluminosilicate-based glass-ceramic powder matrix.

26. The method according to claim 25 wherein said borosilicate-based glass has a softening point in the range from about 625° to about 650° C. and a thermal expansion coefficient in the temperature range from about 25° to about 300° C. in the range from $1 \times 10^{-6}$ to $9 \times 10^{-6}$/°C., and said aluminosilicate-based glass-ceramic has a softening point in the range from about 630° to about 700° C. and a thermal expansion coefficient in the temperature range from about 25° to about 300° C. in the range from about $1 \times 10^{-6}$ to about $9 \times 10^{-6}$/°C.

27. The method according to claim 26 wherein said borosilicate-based glass is in a system selected from the group of consisting of lead borosilicate, lithium borosilicate, potassium borosilicate, calcium borosilicate, sodium borosilicate, magnesium borosilicate, barium borosilicate, aluminum borosilicate, and combinations thereof, and said aluminosilicate-based glass and said aluminosilicate-based glass-ceramic are independently in a system selected from the group consisting of magnesium aluminosilicate, lithium aluminosilicate, zinc aluminosilicate, calcium aluminosilicate, and combinations thereof.

28. The method according to claim 26 wherein said shaped slurry is shaped by tape casting.

29. The method according to claim 26 further comprising the step of applying an electrically conductive metal paste onto a surface of said green composite article.

30. The method according to claim 26 further comprising the step of calcining said green composite article to provide a calcined composite article comprising a plurality of crystalline mullite bubbles dispersed in a matrix selected from the group consisting of a borosilicate-based glass powder matrix, an aluminosilicate-based glass powder matrix, an aluminosilicate-based glass-ceramic powder matrix, and an aluminosilicate-based glass powder and aluminosilicate-based glass-ceramic powder matrix.

31. The method according to claim 26 further comprising the step of applying an electrically conductive metal paste onto a surface of said calcined composite article.

32. The method according to claim 26 further comprising the step of sintering said green composite article to provide a composite ceramic article comprising a plurality of crystalline mullite bubbles dispersed in a matrix selected from the group consisting of a borosilicate-based glass matrix and an aluminosilicate-based glass-ceramic matrix.

33. The method according to claim 32 further comprising the step of calcining said green article prior to said sintering step.

34. The method according to claim 33 wherein said sintering step is done at a temperature in the range from about 820° to about 950° C.

35. The composite article according to claim 1 having a camber of less than about ±0.005 mm.

36. The composite article according to claim 1 having a flexural strength greater than about 50 MPa.

37. The composite article according to claim 1 having a flexural strength greater than about 70 MPa.

38. The composite article according to claim 1 having a flexural strength greater than about 90 MPa.

* * * * *